(12) United States Patent
Embleton et al.

(10) Patent No.: US 10,173,874 B2
(45) Date of Patent: Jan. 8, 2019

(54) INTEGRATED RACK LIFTING APPARATUS

(71) Applicant: DELL PRODUCTS, L.P., Round Rock, TX (US)

(72) Inventors: Steven Embleton, Austin, TX (US); James Don Curlee, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 697 days.

(21) Appl. No.: 14/332,474

(22) Filed: Jul. 16, 2014

(65) Prior Publication Data
US 2016/0016769 A1     Jan. 21, 2016

(51) Int. Cl.
*B66F 9/00* (2006.01)
*B66F 3/46* (2006.01)
*H05K 7/14* (2006.01)

(52) U.S. Cl.
CPC .......... *B66F 9/00* (2013.01); *B66F 3/46* (2013.01); *H05K 7/1488* (2013.01)

(58) Field of Classification Search
CPC ...... B66F 3/46; B66F 7/20; B66F 9/02; B66F 9/061; B66F 9/065; B66F 9/0655; B62B 3/02; B62B 3/06–3/0618; B62B 3/10; B62B 3/108; B62B 5/0083–5/0086; H05K 7/1485–7/1488
USPC ........................................ 254/9 R; 259/89 R
See application file for complete search history.

(56) References Cited

U.S. PATENT DOCUMENTS

| | | | | |
|---|---|---|---|---|
| 4,611,816 A | * | 9/1986 | Traister | B65D 90/143 280/43.2 |
| 5,044,864 A | * | 9/1991 | Stefan | B60B 33/06 254/45 |
| 5,619,263 A | * | 4/1997 | Laughlin | H02G 3/125 248/229.16 |
| 6,425,648 B1 | | 7/2002 | Notohardjono et al. | |
| 6,481,582 B1 | * | 11/2002 | Rinderer | H05K 7/183 211/26 |

(Continued)

FOREIGN PATENT DOCUMENTS

DE     10103934 A1 *  8/2002 ............ H02B 1/308

OTHER PUBLICATIONS

Alvarado, Danny, Dell: Best Practices Guide for Rack Enclosures, PE2420 &PE4220, Dell Data Center Infrastructure, 2009.

*Primary Examiner* — Tyrone V Hall, Jr.
(74) *Attorney, Agent, or Firm* — Isidore PLLC (57) ABSTRACT

A rack-mounted information handling system (IHS) includes a rack to mount functional compute components between opposing lateral sides that are being supported by floor supports. A pair of rack lifting structures are each respectively positioned beside a different opposing lateral side of the rack. Each rack lifting structure includes a foot having at least front and rear floor contacting portions. A vertical support includes a lower portion that is coupled to the foot and an upper portion that extends above an adjacent top lateral frame member of the rack. A top member is coupled to the vertical support and presents front and rear attachment components to engage the adjacent top lateral frame member. A jack engagement surface is defined within the vertical support to receive one or more furniture jacks that can be used to lift the pair of rack lifting structures and the attached rack-mounted IHS.

6 Claims, 8 Drawing Sheets

(56) References Cited

U.S. PATENT DOCUMENTS

| | | | |
|---|---|---|---|
| 6,488,097 B1* | 12/2002 | MacDonald, III | A62C 35/68 |
| | | | 169/16 |
| 7,014,051 B2* | 3/2006 | Rumney | H05K 7/1421 |
| | | | 211/26 |
| 7,448,168 B2* | 11/2008 | Waalkes | A47B 21/06 |
| | | | 52/220.2 |
| 7,687,716 B2* | 3/2010 | Pepe | H04Q 1/142 |
| | | | 174/101 |
| 7,718,891 B2* | 5/2010 | Adducci | H05K 7/186 |
| | | | 174/50 |
| 7,874,433 B2 | 1/2011 | Levesque et al. | |
| 8,424,691 B2 | 4/2013 | McMillan, III et al. | |
| 2003/0041409 A1 | 3/2003 | Caporale | |
| 2003/0091417 A1* | 5/2003 | Swann | B62B 5/0083 |
| | | | 414/458 |
| 2003/0221914 A1 | 12/2003 | Smith et al. | |
| 2004/0020873 A1* | 2/2004 | Henderson | H02B 1/54 |
| | | | 211/26 |
| 2009/0269174 A1* | 10/2009 | Enyart | B65G 1/02 |
| | | | 414/331.03 |
| 2012/0062091 A1* | 3/2012 | Donowho | H04Q 1/062 |
| | | | 312/351.1 |
| 2012/0315115 A1* | 12/2012 | Prosser | B60P 1/5476 |
| | | | 414/467 |
| 2013/0146824 A1* | 6/2013 | Drake | B66F 7/12 |
| | | | 254/92 |
| 2014/0151618 A1* | 6/2014 | Stewart | B66F 3/46 |
| | | | 254/89 R |
| 2015/0076976 A1* | 3/2015 | Bailey | H05K 5/023 |
| | | | 312/223.6 |
| 2016/0121915 A1* | 5/2016 | Mkandawire | B62B 3/02 |
| | | | 414/277 |

* cited by examiner

INTEGRATED RACK LIFTING APPARATUS

BACKGROUND

1. Technical Field

This disclosure generally relates to rack-mounted information handling systems (IHS), and more particular to lifting a fully integrated rack-mounted IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Generally known rack-mounted IHSes support information technology (IT) gear through a frame structure that places all of the weight on a set of floor casters. The rack has limited structural areas that can support the weight of the IT gear and rack other than a portion of the frame structure in the area of the casters. It is necessary in certain instances to lift the rack-mounted IHS. For example, a user may have a requirement to install a seismic kit to support the frame structure rather than the set of casters. The IHS may be configured at the original equipment manufacturer (OEM) with casters in order to deploy to an end user location. At the desired location for operation the casters must be removed and the brackets for the seismic kit installed in the same fastener holes as the casters.

A fully integrated rack-mounted IHS can weigh over 2400 lbs. It is thus difficult to place the rack on its side to replace the set of casters. Even if able to place the rack-mounted IHS on its side, the frame structure and the IT gear can be damaged in this orientation. Lifting the rack-mounted IHS, however, may not be feasible. Often, such data centers have a low overhead clearance due to cable trays and air flow containment that does provide room for a portable crane. A need thus exists for lifting the rack-mounted IHS within a limited amount of space.

BRIEF SUMMARY

The illustrative embodiments of the present disclosure provide a rack lifting apparatus for a rack-mounted information handling system (IHS). In one embodiment, the rack lifting apparatus includes a pair of rack lifting structures that are each respectively positionable beside a different opposing lateral side of the rack-mounted IHS. Each rack lifting structure includes a foot having at least front and rear floor contacting portions. Each rack lifting structure includes a vertical support having a lower portion coupled to the foot and having an upper portion extending above an adjacent top lateral frame member of the rack-mounted IHS. A top member of each rack lifting structure is coupled to the vertical support and presents front and rear attachment components to engage the adjacent top lateral frame member. The rack lifting structure also includes a jack engagement surface that is defined within the vertical support to receive one or more furniture jacks.

According to at least one aspect of the present disclosure, a method for lifting a rack-mounted IHS having a frame that is supportable by both top and bottom lateral frame members includes attaching a first rack lifting structure to a first top lateral frame member and attaching a second rack lifting structure to an opposing second lateral frame member of the rack-mounted IHS. Each of the first and second rack lifting structures extend down to rest upon the floor on respective opposing sides of the rack-mounted IHS. The method further includes engaging a working surface of one or more jacks to a jack engagement surface of at least one of the first and second rack lifting structures. The method further includes raising the rack-mounted IHS by using the one or more jacks.

According to at least one aspect of the present disclosure, a rack-mounted IHS is provided that has a rack with opposing lateral sides between which functional compute components can be mounted. The rack is supportable by either floor supports or by respective top lateral frame members. A pair of rack lifting structures are each respectively positioned beside a different opposing lateral side of the rack. Each rack lifting structure includes a foot having at least front and rear floor contacting portions. Each rack lifting structure further includes a vertical support having a lower portion coupled to the foot and having an upper portion that extends above an adjacent top lateral frame member of the rack. A top member is coupled to the vertical support and presents front and rear attachment components to engage the adjacent top lateral frame member. A jack engagement surface is defined within the vertical support to receive one or more furniture jacks.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The present disclosure provides a rack lifting apparatus that enables lifting of the rack from the sides of the rack using standard jacks. In one embodiment, a rack lifting apparatus includes tapped fastener mounts to lift the weight of information technology (IT) gear and the rack without obstructing an area around the casters. Simple furniture jacks can be employed to lift the rack lifting apparatus and the attached rack. The rack lifting apparatus enables rack IHSes to be elevated in places such as data centers where there is limited overhead space for use of overhead lifts and cranes.

Some original equipment manufacturers (OEM) ships integrated racks to customers around the world. Being able to integrate IT gear into racks, fully cabled, and fully tested at the OEM factory can more efficiently deploy racks to a customer data center and make the rack IHS operational in minimal time. Moving the integration, cabling and testing to the OEM factory and removing the time required once at the customer site is a major value to customers. In the absence of an overhead lift, the IT gear of an integrated rack has to be destacked if access to the bottom is required, such as to remove or replace the casters. De-stacking the IT gear at the customer site to replace the casters is a very labor intensive and expensive option that would decrease this value.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
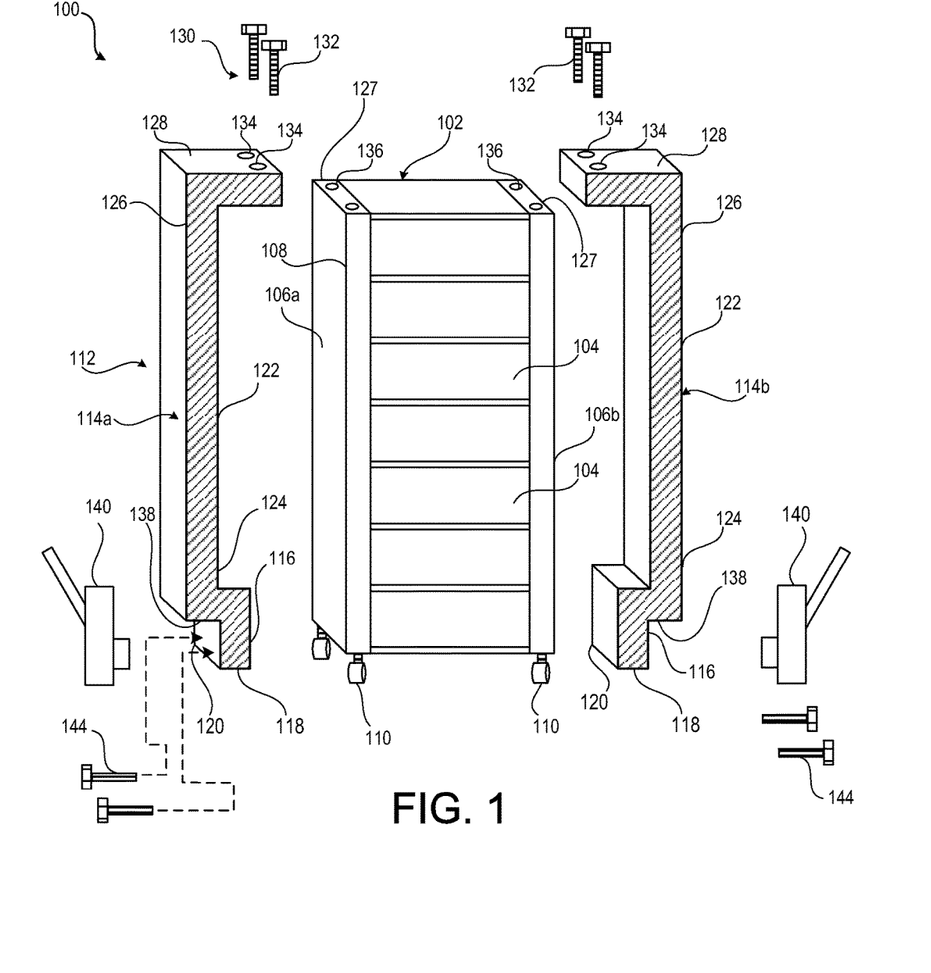
FIG. 1 illustrates a perspective diagram of a rack lifting apparatus and rack-mounted information handling system (IHS), according to one embodiment.

FIGS. 1-4 illustrate a rack-mounted information handling system (IHS) 100 that includes a rack 102 to mount functional compute components 104 to form a fully-integrated IHS. FIG. 1 illustrates a block diagram representation of an example IHS 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The functional compute components 104 may also be referred to as information technology (IT) gear that are mounted between opposing lateral sides 106a, 106b of a frame structure 108 of the rack 102. The frame structure 108 transfers the weight to a set of floor supports 110. FIG. 1 also illustrates a rack lifting apparatus 112 that includes a pair of left and right rack lifting structures 114a, 114b that are each respectively positioned beside a different opposing lateral side 106a, 106b of the rack 102. Each rack lifting structure 114a, 114b can be identical and interchangeable. Each rack lifting structure 114a, 114b includes a foot 116 having at least front and rear floor contacting portions 118, 120. A vertical support 122 has a lower portion 124 coupled to the foot 116 and has an upper portion 126 that extends above an adjacent top lateral frame member 127 of the rack 102. A top member 128 is coupled to the vertical support 122 and presents front and rear attachment components 130 to engage the adjacent top lateral frame member 127. In an exemplary embodiment, the attachment components 130 are fasteners 132 received in through holes 134 that engage corresponding tapped fastener mounts 136 of the top lateral frame member 127 of the rack-mounted IHS 100. As its name implies, rack lifting apparatus 112 is utilized to lift the rack-mounted IHS 100. A jack engagement surface 138 is defined within the vertical support 122 to receive one or more furniture jacks 140 that can be used to lift the pair of rack lifting structures 114a, 114b and the attached rack-mounted IHS 100.

Terms "left" and "right" are provided for clarity with reference to the depictions as viewed. It should be appreciated that the rack lifting structures 114a, 114b may be used from a front and rear of the rack 102. Often a personnel walkway is provided on a cold side (front) and hot side (rear) of the rack-mounted IHSes 100 in a data center to facilitate servicing. Thus, access may be provided on the front and rear for positioning the rack lifting structures 114a, 114b. The left and right sides of the rack 102 may be too close to adjacent racks 102. Conversely, in certain instances it can be desirable to approach the rack 102 for performing certain service functions with the rack 102 lifted and thus the rack lifting structures 114a, 114b can be installed to the left and right sides of the rack 102 instead.

It should be appreciated that the foot 116 of the rack lifting structures 114a, 114b can assist in positioning the top member 128 for attachment to the rack 102. However, the foot 116 is optional and can be omitted in some embodiments.

Figure 2:
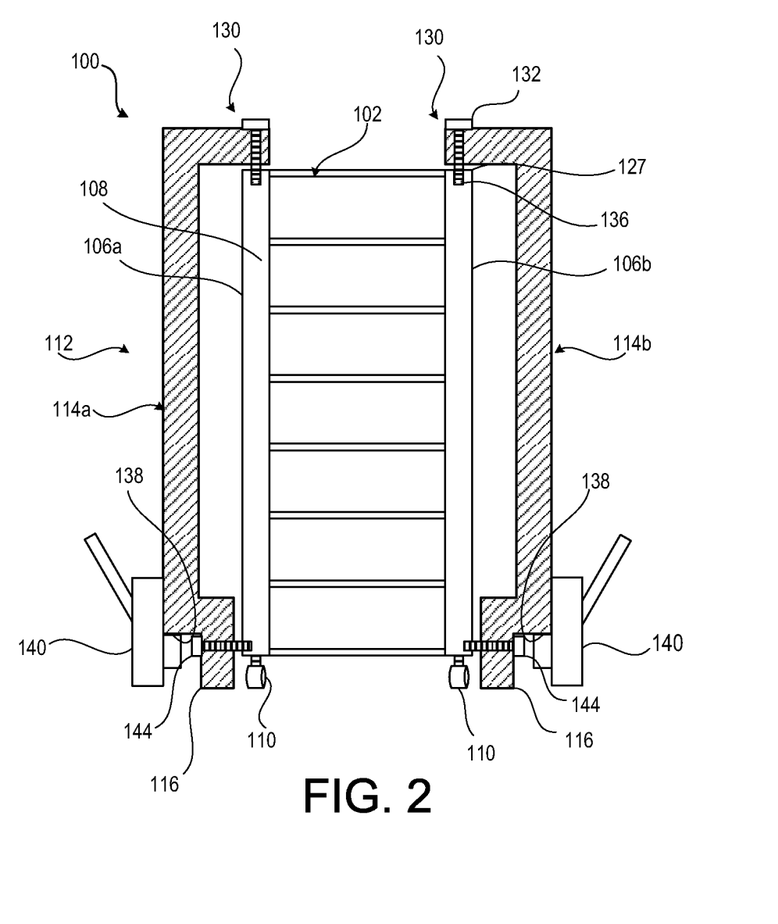
FIG. 2 illustrates a diagram of rack lifting structures of the rack lifting apparatus attached to the top of the rack-mounted IHS with furniture jacks positioned to lift the rack-mounted IHS, according to one embodiment.

FIG. 2 illustrates the rack lifting apparatus 112 attached to the rack 102 of the rack-mounted IHS 100 with the furniture jacks 140 engaged to the jack engagement surfaces 138 on respective rack lifting structures 114a, 114b. Weight of the rack 102 continues to be transferred downward through the frame structure 108 and set of floor supports 110, which are casters. Weight of the rack lifting apparatus 112 is supported by a respective foot 116 of each rack lifting structure 114a, 114b.

Figure 3:
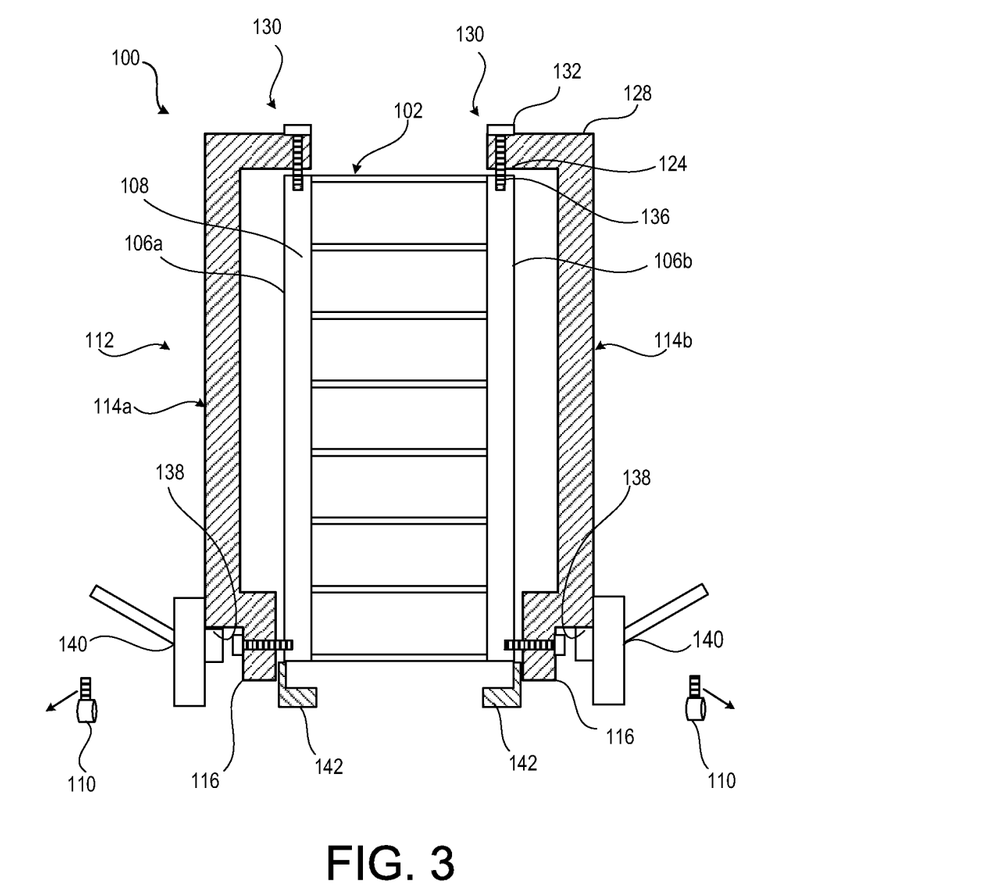
FIG. 3 illustrates a diagram of the furniture jacks actuated to lift the rack-mounted IHS via the rack lifting structures, according to one embodiment.

FIG. 3 illustrates the rack lifting apparatus 112 attached to the rack 102 of the rack-mounted IHS 100 with the furniture jacks 140 engaged to the jack engagement surfaces 138 on respective rack lifting structures 114a, 114b. The furniture jacks 140 are actuated to lift the rack-mounted IHS 100 via the rack lifting apparatus 112. Weight of the rack 102 is transferred upward through the frame structure 108 through the tapped fastener mounts 136 and top fasteners 132 to the top members 128 of the respective rack lifting structures 114a, 114b. With space provided below the rack 102, the floor supports 110 can be removed, as shown. Replacement floor supports 142, such as a seismic kit, are positioned for attachment to the rack 102. FIGS. 1-3 illustrate horizontal fasteners 144 that secures the foot 116 of each rack lifting apparatus 112 to the rack 102 to oppose rotation about the top fasteners 132.

Figure 4:
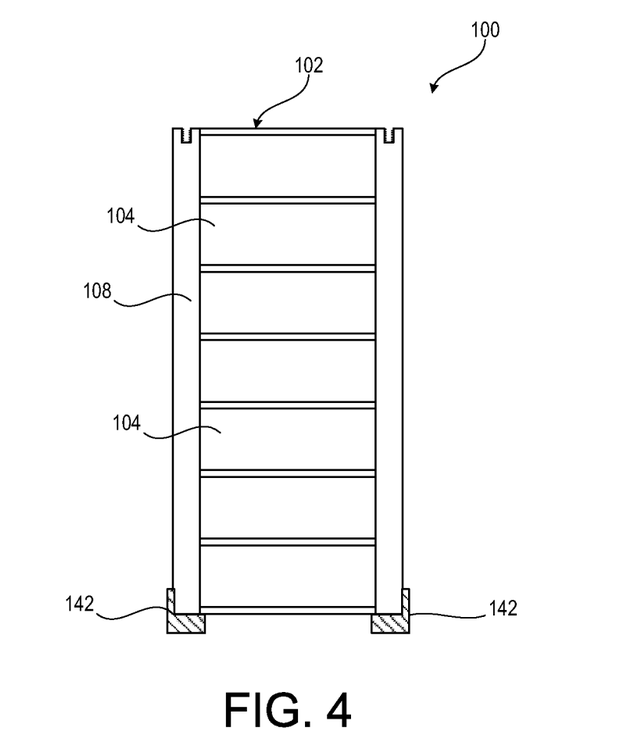
FIG. 4 illustrates a diagram of the rack-mounted IHS supported on replacement floor supports, according to one embodiment.

FIG. 4 illustrates the rack 102 of the rack-mounted IHS 100 supported on the attached replacement floor supports 142. The functional compute components 104 remain fully integrated through the process of replacing floor supports 110 (FIG. 3) with replacement floor supports 142. The frame structure 108 is undamaged during the replacement by transferring weight vertically as designed in tension upward in line with the frame structure 108 when lifted or in compression downward in line with the frame structure when not lifted. Similarly, floor supports 110 (FIGS. 1-3) such as casters can be installed again to move the rack-mounted IHS 100 as necessary.

Figure 5:
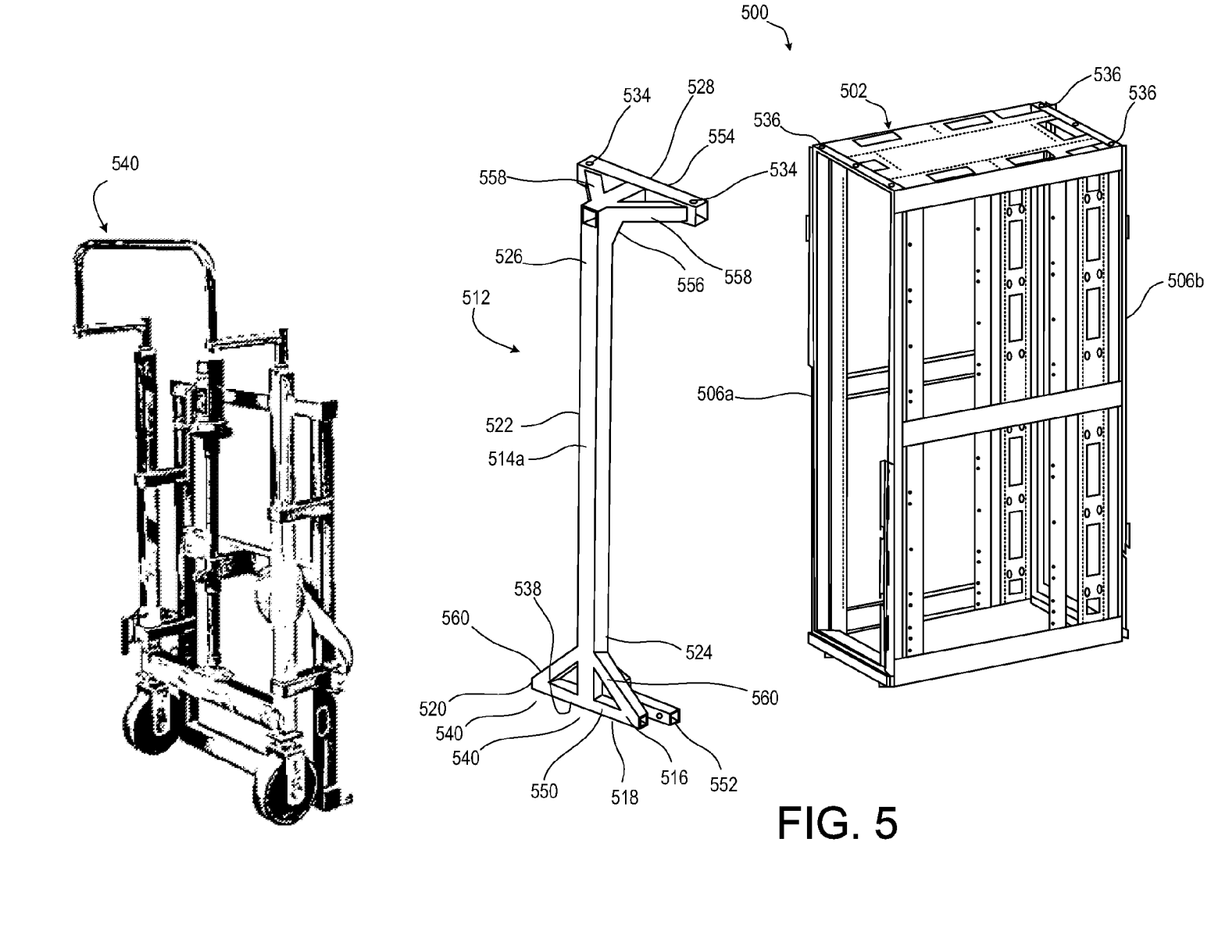
FIG. 5 illustrates a perspective view of an example rack lifting structure and a rack, according to one embodiment.
Figure 6:
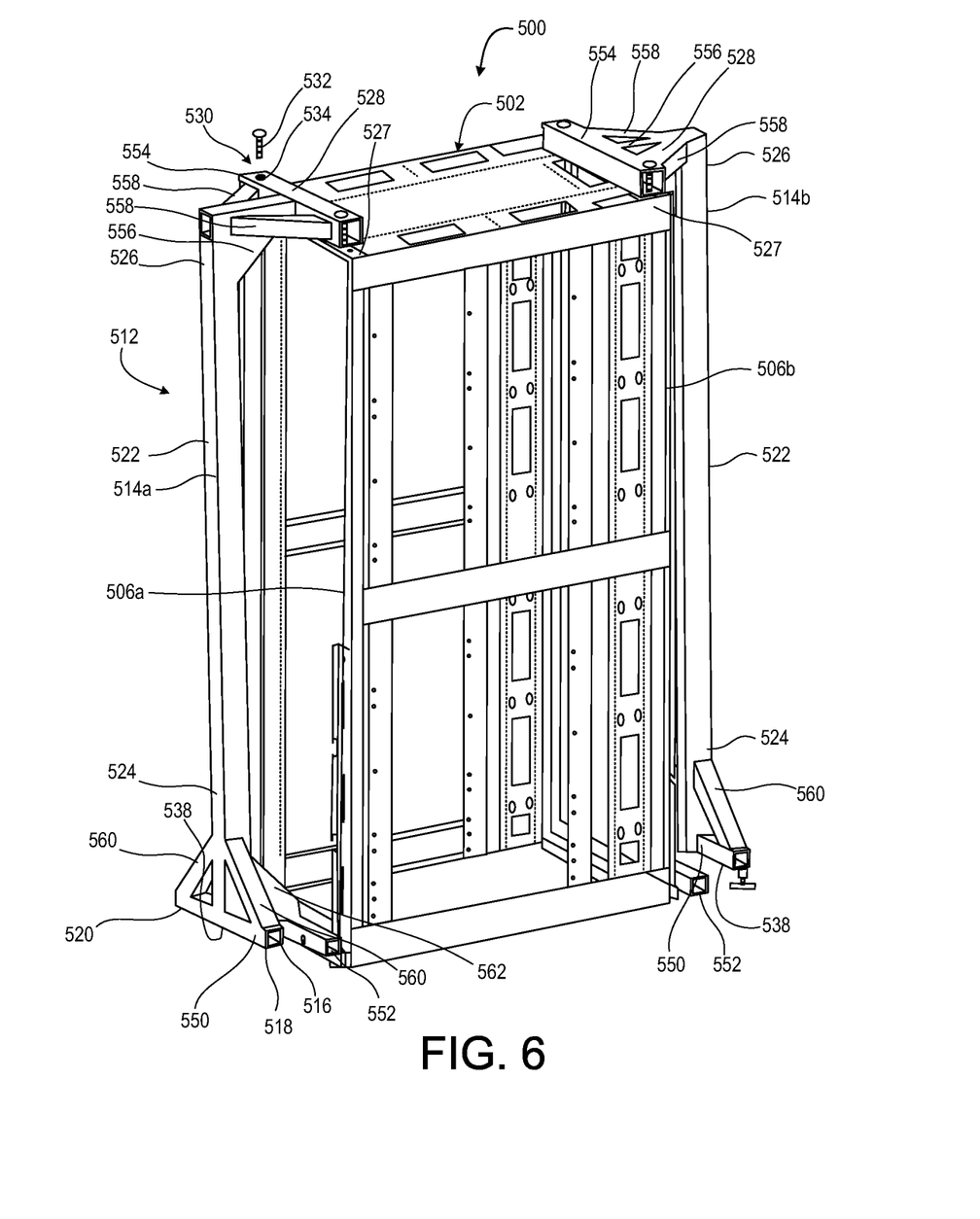
FIG. 6 illustrates a perspective view of an example rack lifting apparatus attached to the rack, according to one embodiment.

FIGS. 5-6 illustrate a rack-mounted IHS 500 having an example rack lifting apparatus 512 to lift a rack 502, according to one embodiment. For clarity, functional compute components 104 (FIG. 1) are omitted. FIG. 5 illustrates a left rack lifting structure 514a spaced apart from the rack 502. With particular reference to FIG. 6, the rack lifting apparatus 512 includes a pair of left and right rack lifting structures 514a, 514b that are each respectively positioned beside a different opposing lateral side 506a, 506b of the rack 502, which correspond to a front (cold side) and a rear (hot side) of the rack-mounted IHS 500. Each rack lifting structure 514a, 514b can be identical and interchangeable. Each rack lifting structure 514a, 514b includes a foot 516 having at least front and rear floor contacting portions 518, 520. A vertical support 522 has a lower portion 524 coupled to the foot 516 and has an upper portion 526 that extends above an adjacent top lateral frame member 527 of the rack 502. A top member 528 is coupled to the vertical support 522 and presents front and rear attachment components 530 to engage the adjacent top lateral frame member 527. In an exemplary embodiment, the attachment components 530 are fasteners 532 received in through holes 534 that engage a corresponding tapped fastener mount 536 (FIG. 5) of the top lateral frame member 527 of the rack-mounted IHS 500.

A jack engagement surface 538 is defined within the vertical support 522 to receive one or more furniture jacks 540 (FIG. 5) that can be used to lift the pair of rack lifting structures 514a, 514b and the attached rack-mounted IHS 500. In one embodiment, the jack engagement surface 538 is a first horizontal member 550, such as a rectangular steel tube, that is spaced away from the floor and that is vertically aligned with and attached to a bottom end of the vertical support 522, which also is a rectangular steel tube. The foot 516 is a second horizontal member 552 that is below the first horizontal member 550. The second horizontal member 552 is displaced inward from the first horizontal member 550 and attached to at least one of the vertical support 522 and the first horizontal member 550. The top member 528 includes a third horizontal member 554 that is attached at an upper portion 526 of the vertical support 522. The top member 528 also includes an upper vertical bracket 556 and a pair of upper horizontal brackets 558 attach the top member 528 to the vertical support 522.

A pair of opposing lower brackets 560 is attached between the vertical support 522 and front and rear portions respectively of the first horizontal member 550. At least one inward lower bracket (FIG. 6) is attached between an inward side of the vertical support 522 and the second horizontal member 552. The pair of opposing lower brackets 560 communicates weight of the rack-mounted IHS 500 when filled with IT gear to the jack engagement surface and in turn to furniture jacks 540 (FIG. 5).

An amount of allowable tipping of a particular rack-mounted IHS 500 can depend upon factors such as the dimensions and strength of the rack 502, the weight of IT gear in the rack 502, etc. In addition, the amount of vertical spacing required to service the floor supports 110 (FIGS.

1-3) can be different. Thus, in certain instances one rack lifting structure 514a or 514b can be raised at a time for servicing. Alternatively, one rack lifting structure 514a or 514b can be raised a portion of the final vertical distance at a time to maintain the rack 502 within an acceptable angle to the vertical, enabling one person to perform the servicing. In other instances, both rack lifting structures 514a, 514b can be raised simultaneously to maintain the rack 502 in a vertical orientation.

Figure 7:
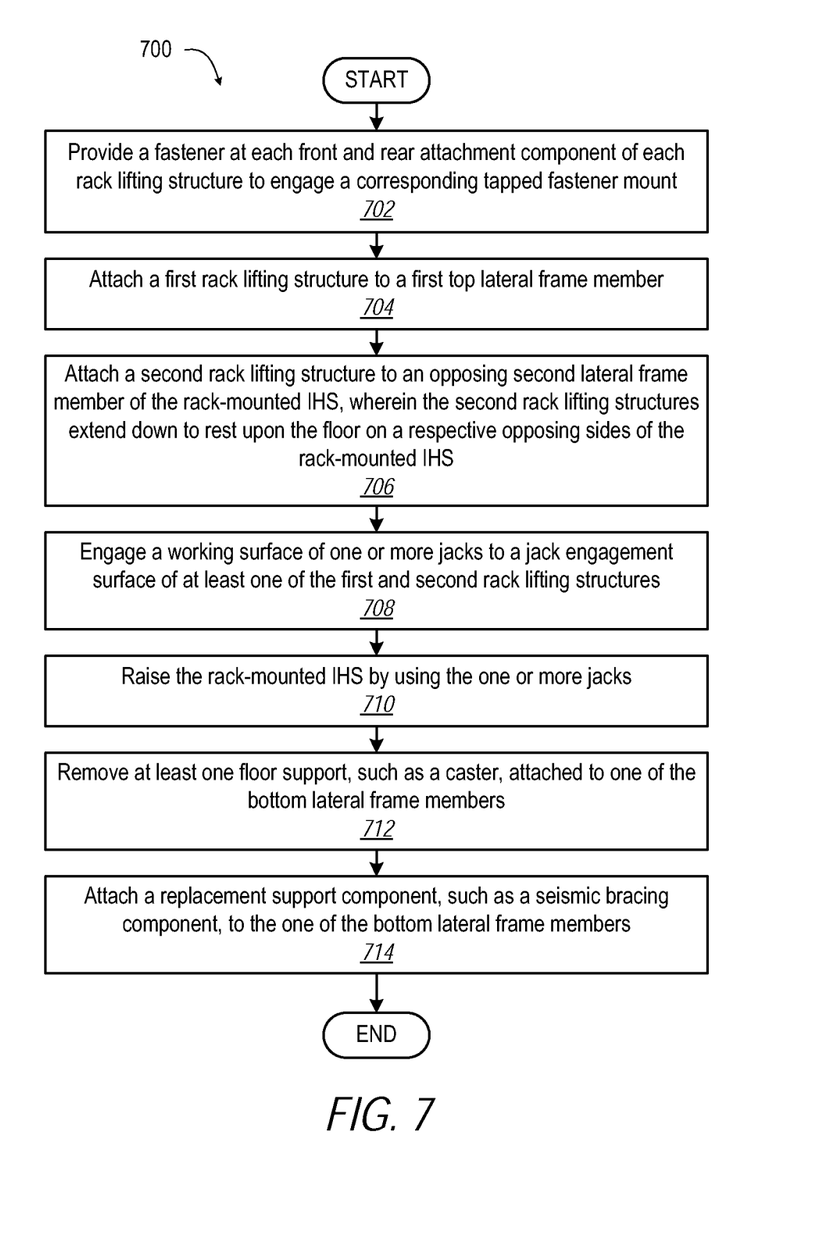
FIG. 7 illustrates a flow diagram of a particular method for lifting an IHS using the rack lifting apparatus, according to one embodiment.

FIG. 7 illustrates a method 700 of lifting a rack-mounted IHS having a frame that is supportable by both top and bottom lateral frame members. In one embodiment, the top lateral frame member of the rack-mounted IHS includes tapped fastener mounts. The method 700 further includes providing a fastener at each front and rear attachment component of a pair of first and second rack lifting structures to engage a corresponding tapped fastener mount (block 702). The method 700 includes attaching a first rack lifting structure to a first top lateral frame member using the fasteners (block 704). The method 700 includes attaching a second rack lifting structure to an opposing second lateral frame member of the rack-mounted IHS. The first and second rack lifting structures extend down to rest upon the floor on respective opposing sides of the rack-mounted IHS (block 706). The method 700 includes engaging a working surface of one or more jacks to a jack engagement surface of at least one of the first and second rack lifting structures (block 708). Then the method 700 includes raising the rack-mounted IHS by using the one or more jacks (block 710). With the lower portion of the rack-mounted IHS suspended, the method 700 further includes removing at least one floor support, such as a caster, attached to one of the bottom lateral frame members (block 712). The method 700 includes attaching a replacement support component, such as a seismic bracing component, to the one of the bottom lateral frame members (block 714).

Figure 8:
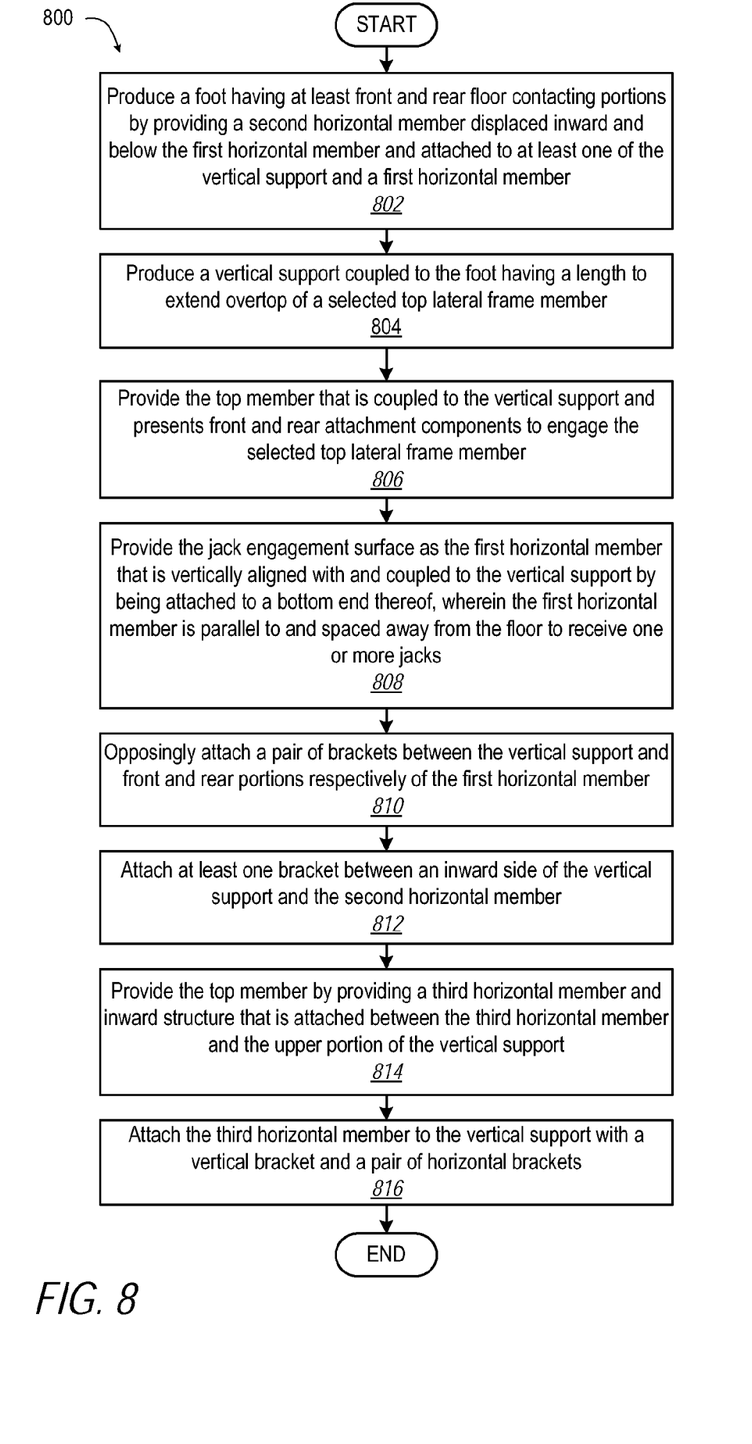
FIG. 8 illustrates a method for producing rack lifting structures.

FIG. 8 illustrates a method 800 for producing rack lifting structures. In one embodiment, the method 800 includes producing a foot having at least front and rear floor contacting portions by providing a first horizontal member and a second horizontal member displaced inward and below the first horizontal member and attached to at least one of a vertical support and a first horizontal member (block 802). The method 800 further includes producing a vertical support having a length to extend over the top of a selected top lateral frame member (block 804). The method includes providing the top member that is coupled to the vertical support and presents front and rear attachment components to engage the selected top lateral frame member (block 806). The method 800 further includes providing the jack engagement surface as the first horizontal member that is vertically aligned with and coupled to the vertical support by being attached to a bottom end thereof. In one embodiment, the previously provided first horizontal member is parallel to and spaced away from the floor to receive one or more jacks to serve as the jack engagement surface (block 808).

In one embodiment, the method 800 provides for increasing the strength of the rack lifting structures by opposingly attaching a pair of brackets between the vertical support and front and rear portions respectively of the first horizontal member (block 810). The method 800 further includes attaching at least one bracket between an inward side of the vertical support and the second horizontal member (block 812). The method 800 further includes providing the top member by providing a third horizontal member and inward structure that is attached between the third horizontal member and the upper portion of the vertical support (block 814).

In one embodiment, the method 800 further includes attaching the third horizontal member to the vertical support with a vertical bracket and a pair of horizontal brackets (block 816).

In the above described flow chart of FIGS. 7-8, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A rack lifting apparatus for a rack-mounted information handling system (IHS), the rack lifting apparatus comprising:
   a pair of rack lifting structures that are each respectively positionable beside a different opposing lateral side of the rack-mounted IHS, each rack lifting structure comprising:
      a foot having at least front and rear floor-contacting portions;
      a vertical support having a lower portion coupled to the foot and an upper portion extending above an adjacent top lateral frame member of the rack-mounted IHS;
      a top member that is coupled to the vertical support and which presents front and rear attachment components to engage the adjacent top lateral frame member; and
      a jack engagement surface that is defined within the vertical support to receive one or more jacks, the jack engagement surface comprising a first horizontal member that is spaced away from the floor and that is vertically aligned with and attached to a bottom end of the vertical support;
      wherein the foot comprises a second horizontal member below the first horizontal member and which is displaced inward from the first horizontal member and attached to at least one of the vertical support and the first horizontal member; and
      wherein each front and rear attachment component of each rack lifting structure comprises a fastener to engage a corresponding tapped fastener mount of the top lateral frame member of the rack-mounted IHS.

2. A rack lifting apparatus for a rack-mounted information handling system (IHS), the rack lifting apparatus comprising:
   a pair of rack lifting structures that are each respectively positionable beside a different opposing lateral side of the rack-mounted IHS, each rack lifting structure comprising:
      a foot having at least front and rear floor-contacting portions;
      a vertical support having a lower portion coupled to the foot and an upper portion extending above an adjacent top lateral frame member of the rack-mounted IHS;
      a top member that is coupled to the vertical support and which presents front and rear attachment components to engage the adjacent top lateral frame member; and
      a jack engagement surface that is defined within the vertical support to receive one or more jacks, the jack engagement surface comprising:
         a first horizontal member that is spaced away from the floor and that is vertically aligned with and attached to a bottom end of the vertical support; and
         the foot comprises a second horizontal member below the first horizontal member and which is displaced inward from the first horizontal member and attached to at least one of the vertical support and the first horizontal member; and
      wherein the top member comprises a third horizontal member that is attached at the upper portion of the vertical support and comprises an upper vertical bracket and a pair of upper horizontal brackets that attach the top member to the vertical support.

3. The rack lifting apparatus of claim 2, wherein each rack lifting structure further comprises:
   a pair of opposing lower brackets attached between the vertical support and front and rear portions respectively of the first horizontal member;
   at least one inward lower bracket attached between an inward side of the vertical support and the second horizontal member; and
   the pair of lower brackets, which communicate, to the jack engagement surface, a weight of the rack-mounted IHS when the IHS is filled with information technology (IT) gear.

4. A rack-mounted information handling system (IHS) comprising:
   a rack utilized to mount functional compute components between opposing lateral sides that are supportable selectively by floor supports and by respective top lateral frame members;
   a pair of rack lifting structures that are each respectively positionable beside a different opposing lateral side of the rack, each rack lifting structure comprising:
      a foot having at least front and rear floor contacting portions;
      a vertical support having a lower portion coupled to the foot and at an upper portion extending above an adjacent top lateral frame member of the rack;
      a top member that is coupled to the vertical support and presents front and rear attachment components to engage the adjacent top lateral frame member; and
      a jack engagement surface that is defined within the vertical support to receive one or more jacks, the jack engagement surface comprising a first horizontal member that is spaced away from the floor and that is vertically aligned with and attached to a bottom end of the vertical support;
      wherein the foot further comprises a second horizontal member below the first horizontal member and which is displaced inward from the first horizontal member and attached to at least one of the vertical support and the first horizontal member; and
      wherein each front and rear attachment component of each rack lifting structure comprises a fastener to engage a corresponding tapped fastener mount of the top lateral frame member of the rack-mounted IHS.

5. The rack-mounted IHS of claim 4, wherein:
   the top member comprises a third horizontal member that is attached at a top portion of the vertical support and comprises an upper vertical bracket and a pair of upper horizontal brackets that attach the top member to the vertical support; and
   each rack lifting structure further comprises:

a pair of opposing lower brackets attached between the vertical support and front and rear portions respectively of the first horizontal member;

at least one inward lower bracket attached between an inward side of the vertical support and the second horizontal member; and the pair of lower brackets that communicate a weight of the rack-mounted IHS when filled with information technology (IT) gear to the jack engagement surface.

6. The rack-mounted IHS of claim 4, wherein the floor supports comprise a set of casters and a seismic kit that are interchanged with the rack supported on jacks via the pair of rack lifting structures.

\* \* \* \* \*